(12) United States Patent
Wang et al.

(10) Patent No.: US 7,693,690 B2
(45) Date of Patent: Apr. 6, 2010

(54) DISJUNCTIVE IMAGE COMPUTATION FOR SEQUENTIAL SYSTEMS

(75) Inventors: Chao Wang, Plainsboro, NJ (US); Aarti Gupta, Princeton, NJ (US); Zijiang Yang, Northville, MI (US); Franjo Ivancic, Jersey City, NJ (US)

(73) Assignee: NEC Laboratories America, Inc., Princeton, NJ (US)

(*) Notice: Subject to any disclaimer, the term of this patent is extended or adjusted under 35 U.S.C. 154(b) by 586 days.

(21) Appl. No.: 11/367,665

(22) Filed: Mar. 3, 2006

(65) Prior Publication Data

US 2007/0044084 A1 Feb. 22, 2007

Related U.S. Application Data

(60) Provisional application No. 60/706,656, filed on Aug. 9, 2005.

(51) Int. Cl.
*G06F 17/50* (2006.01)
*G06F 13/00* (2006.01)

(52) U.S. Cl. .............. 703/2; 703/13; 716/3; 716/5; 714/30

(58) Field of Classification Search ............... 703/2, 703/11, 13; 714/38, 30; 716/3, 5
See application file for complete search history.

(56) References Cited

U.S. PATENT DOCUMENTS

| | | | | |
|---|---|---|---|---|
| 6,185,516 | B1* | 2/2001 | Hardin et al. | 703/2 |
| 6,728,665 | B1* | 4/2004 | Gupta et al. | 703/2 |
| 7,120,568 | B1* | 10/2006 | Geist et al. | 703/13 |
| 7,280,993 | B2* | 10/2007 | Jain | 706/47 |
| 2002/0062463 | A1* | 5/2002 | Hines | 714/38 |
| 2003/0033126 | A1* | 2/2003 | Lincoln et al. | 703/11 |
| 2003/0225552 | A1* | 12/2003 | Ganai et al. | 703/2 |
| 2004/0098682 | A1* | 5/2004 | Jain | 716/5 |
| 2004/0220786 | A1* | 11/2004 | Tiwari et al. | 703/2 |
| 2005/0138474 | A1* | 6/2005 | Jain et al. | 714/30 |
| 2006/0129953 | A1* | 6/2006 | Jain | 716/3 |

* cited by examiner

*Primary Examiner*—Thai Phan
(74) *Attorney, Agent, or Firm*—Joseph J. Kolodka; James Bitetto

(57) ABSTRACT

A symbolic disjunctive image computation method for software models which exploits a number of characteristics unique to software models. More particularly, and according to our inventive method, the entire software model is decomposed into a disjunctive set of submodules and a separate set of transition relations are constructed. An image/reachability analysis is performed wherein an original image computation is divided into a set of image computation steps that may be performed on individual submodules, independently from any others. Advantageously, our inventive method exploits variable locality during the decomposition of the original model into the submodules. By formulating this decomposition as a multi-way hypergraph partition problem, we advantageously produce a small set of submodules while simultaneously minimizing the number of live variable in each individual submodule. Our inventive method produces a set of disjunctive transition relations directly from the software model, without producing a conjunctive transition relation—as is necessary in the prior art. In addition, our inventive method exploits the exclusive use of live variables in addition to novel search strategies which provide still further benefit to our method.

6 Claims, 18 Drawing Sheets

| p3 | p2 | p1 | guard  | q3 | q2 | q1 |
|----|----|----|--------|----|----|----|
| 0  | 0  | 0  | (x==5) | 0  | 0  | 1  |
| 0  | 0  | 0  | !(x==5)| 1  | 0  | 0  |
| 0  | 0  | 1  | true   | 0  | 1  | 0  |
| 0  | 1  | 0  | true   | 0  | 1  | 1  |

FIG. 2

```
R[K]  ---  Reachable State Subsets for (I=; i<K; I++) {
    new = img(Ti, R(i));
    for (j=0; j<K; j++) {
        R[j] = R[j] + (new ^ p==j);
    }
}
```

FIG. 5

```
{
    int a, b;
    a = x + 5;
    if (y==10)
        b = 1;
    else
        b = 2
    z = a + b;
}
```

L6:  goto L2;
```

FIG. 8

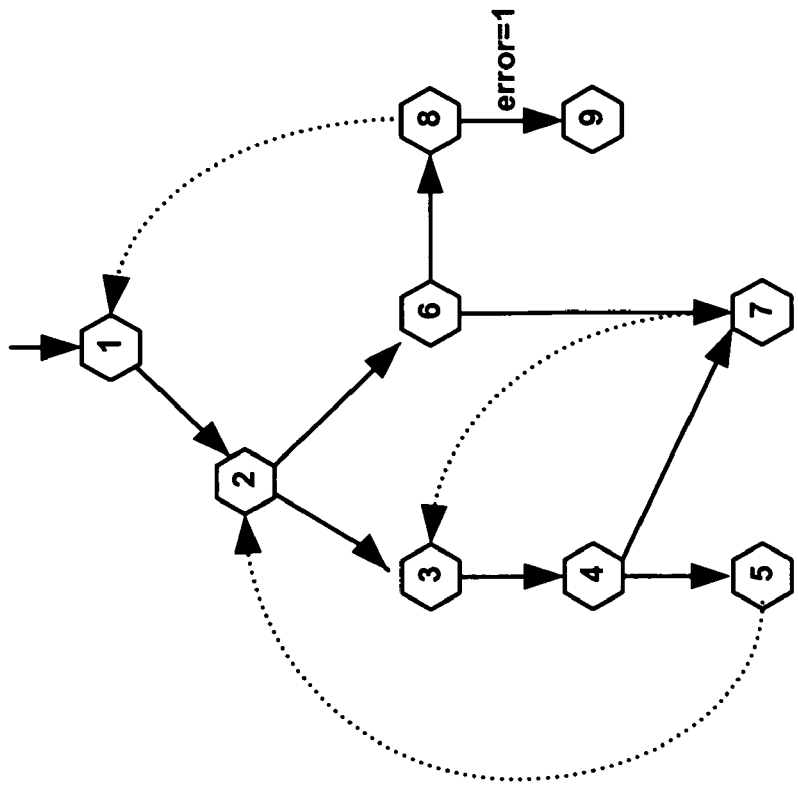
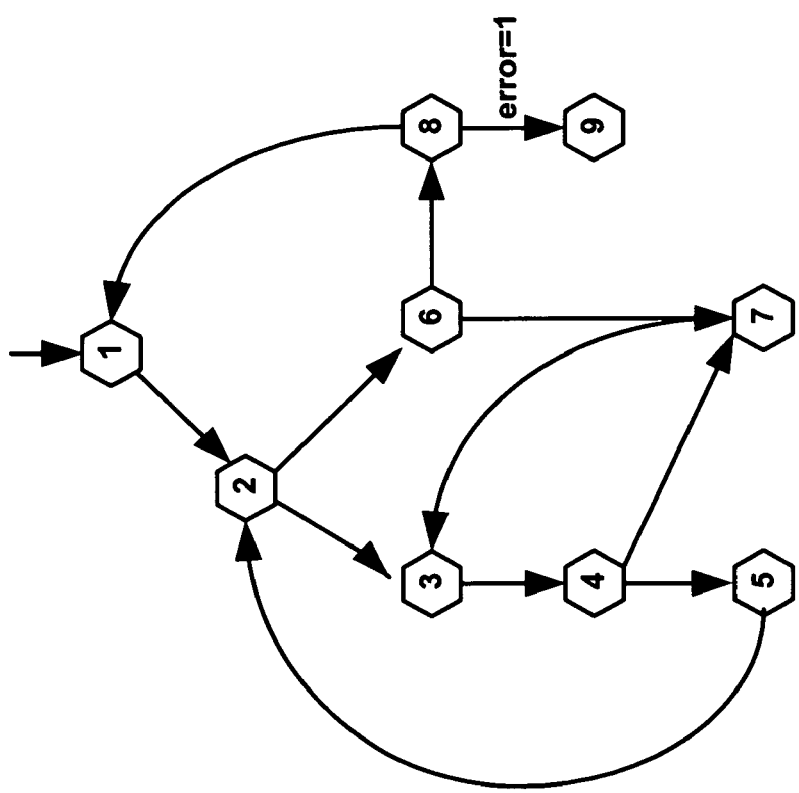
FIG. 11

Algorithm 1 REACH_FRONTIER $(T, I, Err, Spa)$

1: $F = I;$
2: $R = I \cap Spa;$
3: while $F \neq \emptyset$
4:   if $(F \cap Err) \neq \emptyset$ then
5:     return false;
6:   end if
7:   $F = (post(T, F) \setminus F) \setminus R;$
8:   $R = R \cup (F \cap Spa);$
9: end while
10: return true;

FIG. 12

Algorithm 2 REACH_LOCKSTEP ($T_f, T_b, I, Err, Spa$)

1: $F = I$;
2: $R = R_{new} = (I \cap Spa)$;
3: while $F \neq \emptyset$ do
4:   if $(F \cap Err) \neq \emptyset$ then
5:     return false;
6:   end if
7:   $F = (post(T_f, F) \setminus F) \setminus R$;
8:   $R = R \cup (F \cap Spa)$;
9:   $R_{new} = R_{new} \cup (F \cap Spa)$;
10:  if $F = \emptyset$ then
11:    $F = post(T_b, R_{new}) \setminus R$;
12:    $R_{new} = \emptyset$
13:  end if
14: end while
15: return true

FIG. 13

| Line | With All Program Variables | With Live Variables Only |
|---|---|---|
| 1 | $P \equiv 2 \wedge x \equiv 0 \wedge y \equiv 0$ | $P \equiv 2$ |
| 2 | $P \equiv 3 \wedge x \equiv 7 \wedge y \equiv 0$ | $P \equiv 3 \wedge x \equiv 7$ |
| 3 | $P \equiv 4 \wedge x \equiv 7 \wedge y \equiv 0 \wedge s \equiv 7$ | $P \equiv 4 \wedge s \equiv 7$ |
| 4 | $P \equiv 5 \wedge x \equiv 7 \wedge y \equiv 8 \wedge s \equiv 7$ | $P \equiv 5 \wedge s \equiv 7 \wedge y \equiv 8$ |
| 5 | $P \equiv 6 \wedge x \equiv 7 \wedge y \equiv 8 \wedge s \equiv 8$ | $P \equiv 6 \wedge s \equiv 8$ |
| 6 | $P \equiv 2 \wedge x \equiv 7 \wedge y \equiv 8 \wedge s \equiv 8$ | $\emptyset$ |
| 2' | $P \equiv 3 \wedge x \equiv 7 \wedge y \equiv 8 \wedge s \equiv 8$ | $\emptyset$ |
| 3' | $\emptyset$ | $\emptyset$ |

Table 1

FIG. 14

| Test Cases | | BFS depth | CPU Time (s) | | | Peak Live BDD (k) | | |
|---|---|---|---|---|---|---|---|---|
| name | vars | | Old | New | New 2 | Old | New | New 2 |
| ssdf | 37 | 11 | 0.01 | 0.04 | 0.04 | 0.8 | 0.8 | 0.8 |
| sfi | 105 | 47 | 0.53 | 0.65 | 0.76 | 4.6 | 4.0 | 4.4 |
| sirpp | 169 | 52 | 8.2 | 6.4 | 5.2 | 10 | 10 | 9.6 |
| srb | 343 | 43 | 2766 | 146 | 33 | 925 | 106 | 65 |
| srr | 856 | 316 | 5426 | 151 | 171 | 990 | 57 | 23 |
| smhb | 888 | 104 (25) | >2h | 341 | 675 | - | 120 | 1022 |
| siic | 967 | 162 | 5116 | 289 | 577 | 1219 | 120 | 1022 |
| spr | 1001 | 617 (85) | 4020 | 260 | 242 | 1188 | 79 | 60 |
| sdir | 1050 | 209 (136) | >2h | 1617 | >2h | - | 430 | - |
| srdo | 1211 | 215 (128) | 3381 | 362 | 3600 | 428 | 154 | 420 |
| ppp | 1435 | (277) | >2h | 394 | 454 | - | 120 | 108 |
| daisy | 8392 | (208) | 7122 | 371 | 428 | 3135 | 120 | 108 |
| | | | >2h | 496 | 545 | - | 145 | 76 |
| | | | 5547 | 470 | 500 | 2482 | 145 | 76 |
| | | | >2h | 6294 | >2h | - | 1550 | - |
| | | | 7200 | 2914 | 6371 | 3194 | 540 | 836 |
| | | - | >2h | >2h | >2h | - | - | - |

Table 2

| Model name | CPU time (s) | | | Peak live BDD (k) | | | Num. partitions | | |
|---|---|---|---|---|---|---|---|---|---|
| | live | asgn | cfg | live | asgn | cfg | live | asgn | cfg |
| sssdf | 0.02 | 0.02 | 0.02 | 0.8 | 0.8 | 0.8 | 1 | 1 | 1 |
| sfi | 0.6 | 0.6 | 0.6 | 4 | 4 | 4 | 1 | 1 | 1 |
| sirpp | 6 | 6 | 6 | 10 | 10 | 10 | 1 | 1 | 1 |
| srb | 146 | >1h | 112 | 106 | - | 71 | 4 | 4 | 4 |
| srr | 151 | 115 | 132 | 57 | 46 | 45 | 15 | 17 | 20 |
| smhb | 343 | 2723 | 1533 | 120 | 1726 | 2270 | 12 | 10 | 14 |
| siic | 260 | 251 | 291 | 79 | 85 | 105 | 11 | 11 | 12 |
| spr | 1617 | >1h | 3156 | 430 | 172 | - | 15 | 14 | 14 |
| sdir | 394 | 318 | 378 | 120 | 150 | 86 | 17 | 19 | 24 |
| srdo | 496 | 443 | 494 | 145 | 97 | 98 | 18 | 20 | 25 |
| ppp* | 3592 | >1h | >1h | 731 | - | - | 17 | 17 | 28 |
| daisy* | >1h | >1h | >1h | - | - | - | | | |

Table 3

| Test Program | | | | Total CPU Time (s) | | | | Peak GEQ Formulas | | | |
|---|---|---|---|---|---|---|---|---|---|---|---|
| name | loc | vars | blks | old | live | front | lstep | old | live | front | lstep |
| bakery | 94 | 10 | 26 | T/O | 755 | 35 | 13 | - | 1518 | 264 | 128 |
| tcas-1a | 1652 | 59 | 133 | T/O | T/O | T/O | 374 | - | - | - | 17656 |
| tcas-any | 1652 | 65 | 215 | T/O | T/O | T/O | 415 | - | - | - | 14920 |
| ppp | 2623 | 91 | 720 | T/O | T/O | T/O | 51 | - | - | - | 3782 |
| mcf1_as | - | 92 | 92 | 2475 | 57 | 3 | 2 | 3394 | 355 | 45 | 45 |
| mcf2_afr | - | 126 | 155 | T/O | 91 | 7 | 5 | - | 344 | 110 | 165 |
| mcf3_mrr | - | 80 | 299 | T/O | 79 | 4 | 4 | - | 407 | 55 | 55 |
| bftpd_useringrp | 1115 | 242 | 13 | 12 | 1 | 1 | 1 | 829 | 6 | 4 | 4 |
| bftpd_chkuser | 2584 | 591 | 175 | M/O | 94 | 20 | 20 | - | 187 | 57 | 57 |
| bftpd_chkshell | 2931 | 674 | 364 | M/O | 94 | 47 | 94 | - | 995 | 358 | 358 |
| bftpd_chkpasspwd | 1166 | 547 | 463 | M/O | 94 | 760 | 760 | - | 579 | 2362 | 2362 |

Table 4

FIG. 17

| Test Program | | | Completed | | | CPU Time (s) | | | non-lin |
|---|---|---|---|---|---|---|---|---|---|
| name | bvars | depth | bdd-mc | sat-bmc | mix-ls | bdd-mc | sat-bmc | mix-ls | |
| bakery | 84 | 172 | Y | (68) | Y | 2 | T/O | 13 | |
| tcas-1a | 307 | 119 | Y | (103) | Y | 433 | T/O | 374 | |
| tcas-any | 362 | 181 | (103) | (100) | Y | T/O | T/O | 415 | |
| ppp | 1435 | 132 | Y | (84) | Y | 687 | T/O | 51 | |
| mcf1_as | 500 | 192 | Y | (98) | Y | 150 | T/O | 2 | ☆ |
| mcf2_afr | 508 | 211 | Y | (60) | Y | 110 | T/O | 5 | |
| mcf3_mrr | 1212 | 148 | Y | (43) | Y | 190 | T/O | 4 | |
| bftpd_useringrp | 1163 | 11 | Y | Y | Y | 1 | 1 | 1 | |
| bftpd_chkuser | 5000 | 75 | (0) | (70) | Y | T/O | T/O | 20 | |
| bftpd_chkshell | 7819 | 94 | (0) | (44) | Y | T/O | T/O | 40 | |
| bftpd_chkpasspwd | 2826 | 147 | (10) | (13) | Y | T/O | T/O | 760 | |

Table 5

FIG. 18

DISJUNCTIVE IMAGE COMPUTATION FOR SEQUENTIAL SYSTEMS

CROSS REFERENCE TO RELATED APPLICATIONS

This application claims the benefit under 35 U.S.C. §119(e) of U.S. Provisional Application No. 60/706,656 filed Aug. 9, 2005, the entire contents and file wrapper of which are hereby incorporated by reference for all purposes into this application.

This invention relates generally to the field of computer software verification, and in particular to a disjunctive method model checking of computer software.

BACKGROUND OF THE INVENTION

Model checking is a formal method for proving that a finite-state model satisfies a user-specified property. As a result of the development of symbolic state space traversal algorithms based on Binary Decision Diagrams (BDDs) and Boolean Satisfiability Solvers (SAT), model checking has become widely recognized as an effective technique for hardware verification. Its utility is not limited to hardware however therefore model checking is being used for software verification as well—especially for transaction-level system designs (in SystemC, for example) and in embedded software (e.g., C/C++).

As is known by those skilled in the art, complexities associated with model checking methods depend upon the size of the state space being modeled which is generally exponential in terms of the number of state variables (or memory elements) of the particular model employed. This exponential dependence may easily cause what is known in the art as memory "blow up"—a major hurdle to be overcome in applying model checking to relatively large systems.

One methodology which partially addressed the exponential dependence and resulting memory explosion is through the use of BDDs. BDD based symbolic model checking was first described by K. McMillan in a book entitled "Symbolic Model Checking", published by Kluwer in 1993. As described by F. Ivancic, I. Shlyakhter, A. Gupta, M. K. Ganai, V. Kahlon, C. Wang and Z. Yang in a paper entitled "Model Checking C Program Using F-Soft", which appeared in *Proceedings of IEEE International Conference on Computer Design*, 2005, BDD based symbolic model checking traverses the state space symbolically by employing symbolic graph algorithms that represent sets of states in Boolean functions. Consequently, their complexity depends upon the size of the BDD representations instead of the number of states. And while symbolic model checking can effectively manage much larger models, it too is subject to the blow-up problem described previously.

As a result, formal verification researchers have searched for heuristics that avoid this BDD blow up. One such approach involves efficient algorithms for conducting image computation—a fundamental computation in symbolic model checking—which has been extensively studied and characterized for hardware models, in particular. (See, e.g., O. Coudert, et al., "Verification of Sequential Machines Based on Symbolic Execution"; in *Automatic Verification Methods for Finite State Systems*, J. Sifakis, ed., pp. 365-373, Springer-Verlag, 1989).

Software models however, exhibit certain unique characteristics that make them significantly more difficult for the application of existing model checkers. First, the number of state variables (or memory elements) in a software model is typically much larger than that found in a hardware model. Additionally, and as compared with hardware models, software models usually have much deeper sequential depths. As such, without wide counters, an arbitrary state of a hardware model can often be reached within only a few clock cycles. For most software models however, the number of steps required to reach a particular state may be orders of magnitude larger. Consequently, conventional BDD based model checking algorithms do not work particularly well on software models. (See, e.g., S. Edwards et al., "Using A Hardware Model Checker To Verify Software", *Proceedings of the 4th International Converence on ASIC (ASICON '01)*, IEEE, October 2001.)

As a result, new approaches of model checking more directly applicable to software models would represent a significant advance in the art. Such an approach is the subject of the instant invention.

SUMMARY OF THE INVENTION

We have developed, in accordance with the principles of the invention, a BDD based disjunctive image computation method for software models which exploits a number of characteristics unique to software models.

More particularly, and according to our inventive method, the entire software model is decomposed into a disjunctive set of submodules, for which a separate set of transition relations are constructed. An image/reachability analysis is performed wherein an original image computation is divided into a set of image computation steps that may be performed on individual submodules, independently from any others.

Advantageously, our inventive method exploits variable locality during the decomposition of the original model into the submodules. The number of live variables in the transition relation of each submodule is drastically reduced, leading to a significant performance improvement in image computation. By formulating this decomposition as a multi-way hypergraph partition problem, we advantageously produce a small set of submodules while simultaneously minimizing the number of live variable in each individual submodule.

In sharp contrast to the prior art, our inventive method produces a set of disjunctive transition relations directly from the software model, without producing a conjunctive transition relation—as is necessary in the prior art. Our inventive method also exploits the exclusive use of live variables to decompose the original model into a set of submodules. In addition, our inventive method applies several novel frontier and lockstep symbolic search strategies which provide still further benefit to our method.

BRIEF DESCRIPTION OF THE DRAWING

A more complete understanding of the present invention may be realized by reference to the accompanying drawing in which:

FIG. 2 is an example of a state transition table;

FIG. 5 is a program excerpt showing a reachability analysis with partitioned reachable subsets;

FIG. 6 is a program excerpt showing locally defined variables a and b;

FIG. 7 is a program excerpt showing globally defined variable x;

FIG. 8 is a program excerpt showing earlier convergence of reachability analysis;

FIGS. 11(a) and 11(b) are Labeled Transition Graphs (LTG) with cycles showing: (a) the original graph; and (b) the graph with back edges removed;

FIG. 12 shows Algorithm 1 depicting our REACH$_{13}$ FRONTIER technique according to the present invention;

FIG. 13 shows Algorithm 2 depicting our REACH$_{13}$ LOCKSTEP technique according to the present invention;

FIG. 14 shows TABLE 1 depicting new reachable states discovered after each BFS step;

FIG. 15 shows TABLE 2 depicting performance comparisons in the reachability analysis;

FIG. 16 shows TABLE 3 depicting the comparisons of three partitioning heuristics with NEW;

FIG. 17 shows TABLE 4 depicting the comparisons of different search strategies in reachability fixpoint computations; and FIG. 18 shows TABLE 5 depicting the comparisons of mixed lock step with pure Boolean level algorithms.

DETAILED DESCRIPTION

In discussing our inventive method, it is noted that sequential software has some useful characteristics that hardware does not. First, program variables in software often exhibit a higher degree of locality. In particular, many are defined either as local variables or are effective only in part of the entire program. This locality information is relatively easy to retrieve because it is available in the source code. In addition, state transitions associated with software are sequential in nature; that is, at any point in the program, only a very limited number of state variables can change their values. Variables in hardware on the other hand, are updated simultaneously which means that their values can rarely be updated independently from one other. Advantageously, our inventive method exploits these characteristics of software.

Figure 1:
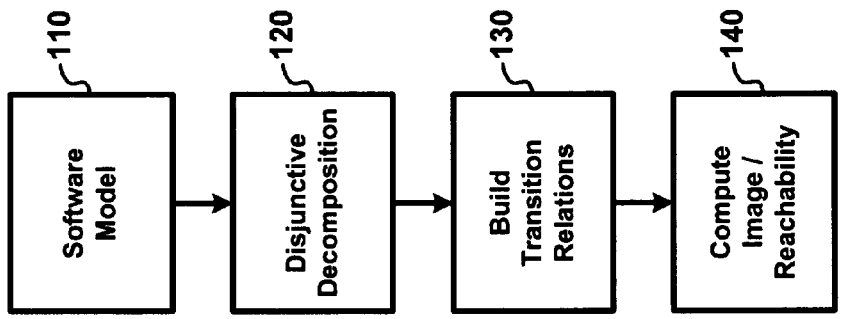
FIG. 1 is flowchart of our method according to the present invention.

FIG. 1 is a high-level flowchart depicting the steps associated with our inventive method. In particular, a software model 110 is disjunctively decomposed 120 using hypergraph partitions to maximize variable locality. A set of transition relations 130 are then constructed directly—without any conjunctive intermediary. Finally, an image/reachability analysis is performed 140 using advanced techniques such as BDDs and multiple symbolic representations, variable live scope, frontier and lockstep analysis to advantageously speed up the necessary computations.

Software Model Checking

To understand the operation of our inventive method however, we first must explain how our verification model is constructed from a software program, and then formally define the software model and symbolic model checking algorithm employed.

Software Models

According to our inventive software modeling method, a program—in this example one written the C programming language—is first preprocessed to remove any complex control structures and expressions. Such preprocessing includes rewriting statements with side-effects into equivalent statements without side-effect and replacing pointers and arrays with sets of equivalent simple variables through aliasing. In addition, variables are also renamed so that their names are unique throughout the whole program. Finally, if recursive data structures exist in the program, they are flattened out—up to a user-specified bound. After the preprocessing is completed, the software program contains only simple variables of integer/char type. At this point, it is noted that our current implementation ignores floating point arithmetic operations, although our invention is not so limited.

When BDDs are used as the underlying symbolic representations, each simple variable in the program is then encoded by a set of binary state variables. The number of bits needed to encode a particular program variable depends on the variable range. For example, unless the range is estimated by applying some kind of range analysis, an integer variable will require 32 bits, while a char variable will require only 8. In addition to these program variables, a set of binary variables are created to encode program locations, i.e., values of the program counter. Integer arithmetic operations are translated by instantiating pre-defined logic blocks (e.g. adders and multipliers).

Subsequent to the variable encoding, a control flow graph of the program is constructed, from which the verification model is constructed. In the control flow graph, statements are grouped into basic blocks, each of which may comprise multiple statements. Advantageously, the basic blocks are constructed in such a way that all statements inside the same basic block may be executed in parallel.

Importantly, only one program counter value is allocated for each basic block (as opposed to each individual statement). Consequently, the sequential depth experienced during symbolic search is reduced. As a result of this encoding scheme, the finite model is represented implicitly in terms of a set of binary state variables and their corresponding next-state functions.

To build the next-state functions, we first represent the control flow graph as a state transition table. An example of such a table is given in FIG. 2, where $P=\{p_1, p_2, p_3\}$ represents the current value of the Program Counter (PC) variable, while $Q=\{q_1, q_2, q_3\}$ represents the next-state value. The column guard comprises those conditions under which transitions among basic blocks are made. In this example depicted in FIG. 2, the program begins at Block 0 (whose binary encoding is 000b). If the expression (x==5) evaluates to true, the program proceeds to Block 1 (001b), otherwise it proceeds to Block 4 (100b). Based upon this table, the next-state functions of PC variables, denoted by $\delta_{q1}$, $\delta_{q2}$, and $\delta_{q3}$, respectively, are given as follows:

$$\delta_{q3}=(P\equiv 0 \wedge x \neq 5)\vee\ldots,$$

$$\delta_{q2}=(P\equiv 1)\vee(P\equiv 2)\vee\ldots,$$

$$\delta_{q3}=(P\equiv 0 \wedge x \equiv 5)\vee(P\equiv 2)\vee\ldots,$$

where ($P\equiv 0$) means that P evaluates to 0, whose equivalent Boolean formula is:

$$\neg p_3 \wedge \neg p_2 \wedge \neg p_1.$$

The next-state functions of program variables are constructed in a similar way. For example, assume that $x_i$ is assigned only inside Blocks 1 and 5, to $expr_1$ and $expr_5$, respectively. The next-state of $x_i$ denoted by $\delta_{y_i}$ (where $y_i$ is the corresponding next-state variable), is given as follows:

$$(P\equiv 1 \wedge exp\ r_1)\vee(P\equiv 5 \wedge exp\ r_5)\vee(P\neq 1 \wedge x_i).$$

That is, the value of $x_i$ should remain unchanged in those blocks where it is not explicitly assigned. If we use $X=\{x_1, x_2, \ldots, x_N\}$ to denote the entire set of program variables whose next-state variables are $\{y_1, y_2, \ldots, y_N\}$, the construction of a next-state function for $x_i$ is illustrated by FIG. 3, which shows the next-state logic of a binary state variable.

Figure 3:
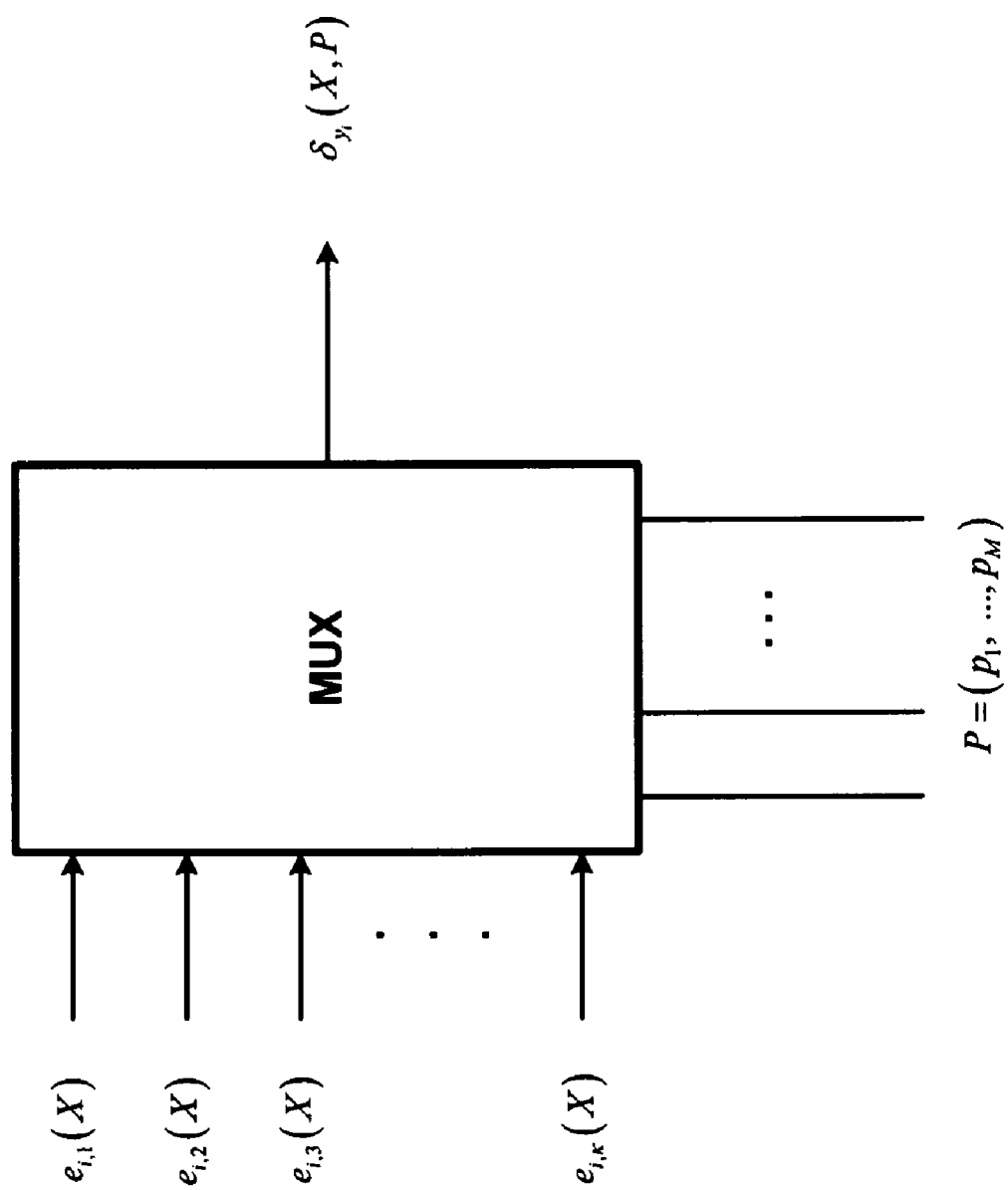
FIG. 3 is a simple block diagram showing the next-state logic of a binary state variable.

With reference to that FIG. 3, it can be seen that $\delta_{y_i}$ denotes the next-state function of $x_i$; MUX is a multiplexer such that when control signal is set such that (P=j), the output of the multiplexer is equal to $e_{i,j}(X)$.

To formalize this, we let our model be represented in terms of: (1) a set of present-state program variables $X=\{x_1, x_2, \ldots, x_N\}$ and a set of present-state PC variables $P=\{p_1, p_2, \ldots p_M\}$; and (2) a set of next-state program variables $Y=\{y_1, y_2, \ldots y_N\}$ and a set of next-state PC variables $Q=\{q_1, q_2, \ldots, q_M\}$. If we let the PC value be an integer $j \in \{1, 2, \ldots, K\}$, and let $e_{i,j}(X)$ be the expression assigned to $x_i$ in Block j we then have:

if $x_i$=expr(X) is in Block j;

then $e_{i,j}(X)$=expr(X), else $e_{i,j}(X)=x_i$;

and $\delta_{y_i}(X,P) = \vee_j (P=j) \wedge e_{i,j}(X)$.

Symbolic Model Checking

In symbolic model checking, the state transition graph of the model is represented symbolically by (T,I), where T(X,P,Y,Q) is the characteristic function of the transition relation, and I (X,P) is the initial state predicate. We let $\tilde{X},\tilde{P},\tilde{Y},$ and $\tilde{Q}$ be the valuations of X,P,Y,and Q, respectively. If the valuation of present-state variables makes $I(\tilde{X},\tilde{P})$ true, the corresponding state $(\tilde{X},\tilde{P})$ is an initial state. Similarly, T $(\tilde{X},\tilde{P},\tilde{Y},\tilde{Q})$ is true if and only if there is a transition from state $(\tilde{X}, \tilde{P})$ to state $(\tilde{Y}, \tilde{Q})$. Note that both the transition relation and sets of states are represented by Boolean functions, which are in turn represented by BDDs.

Since T(X,P,Y,Q) is the conjunction of all the transition bit-relations, $$T = \prod_{1 \le i \le N} T_{y_i}(X, P, y_i) \wedge \prod_{1 \le l \le M} T_{q_l}(X, P, q_l),$$

where $T_{y_i}$ is the bit-relation for a program variable, while $T_{q_l}$ is the bit-relation for a PC variable. It is noted that Bit-relations are defined as follows:

$T_{y_i}(X,P,y_i) = y_i \leftrightarrow \delta_{y_i}(X,P)$, $T_{q_l}(X,P,q_l) = q_l \leftrightarrow \delta_{q_l}(X,P)$.

Much of our inventive technique involves checking reachability properties, e.g. whether a certain program location is reachable or not. These reachability properties are checked through processes known as a reachability analysis.

As can be appreciated by those skilled in the art, reachable states can be computed symbolically on <T,I>, by repeatedly adding the image of already reached states, starting from the initial states. The image of a set of states D, comprising all of the successors of D in the graph, is denoted by $EX_T D$. Reachability analysis is then formulated into a fix-point computation, represented by:

$R = \mu Z. I(X,P) \cup EX_T Z$ where $\mu Z$. represents the least fix-point and Z is an auxiliary iteration variable. That is to say, a point reached when one repeatedly adds the successors of already-reached states, until the result stops growing.

The image of D is then computed as follows:

$EX_T D = \exists X, P, T (X,P,Q,Y) \wedge D (X,P)$.

Since T is the conjunction of many bit-relations, image computation includes a series of conjoin-quantify operations. Different orders of these operations may lead to quite different peak BDD size for the intermediate products. Ordering these operations such that peak memory usage is kept low—also called the quantification scheduling problem—has been the focus of a lot of research and a large number of heuristics in addition to mature implementations are publicly available and known to those skilled in the art.

Disjunctive Image Computation

Unfortunately, the simple implementation of software model checking as outlined so far does not perform well in practice. To verify this, we have constructed a verification model for an embedded software program. Our model, called PPP (Point-to-Point Protocol), has the classic symbolic reachability analysis in VIS applied to it. In particular, the finite state model has 1435 binary state variables.

Figure 4:
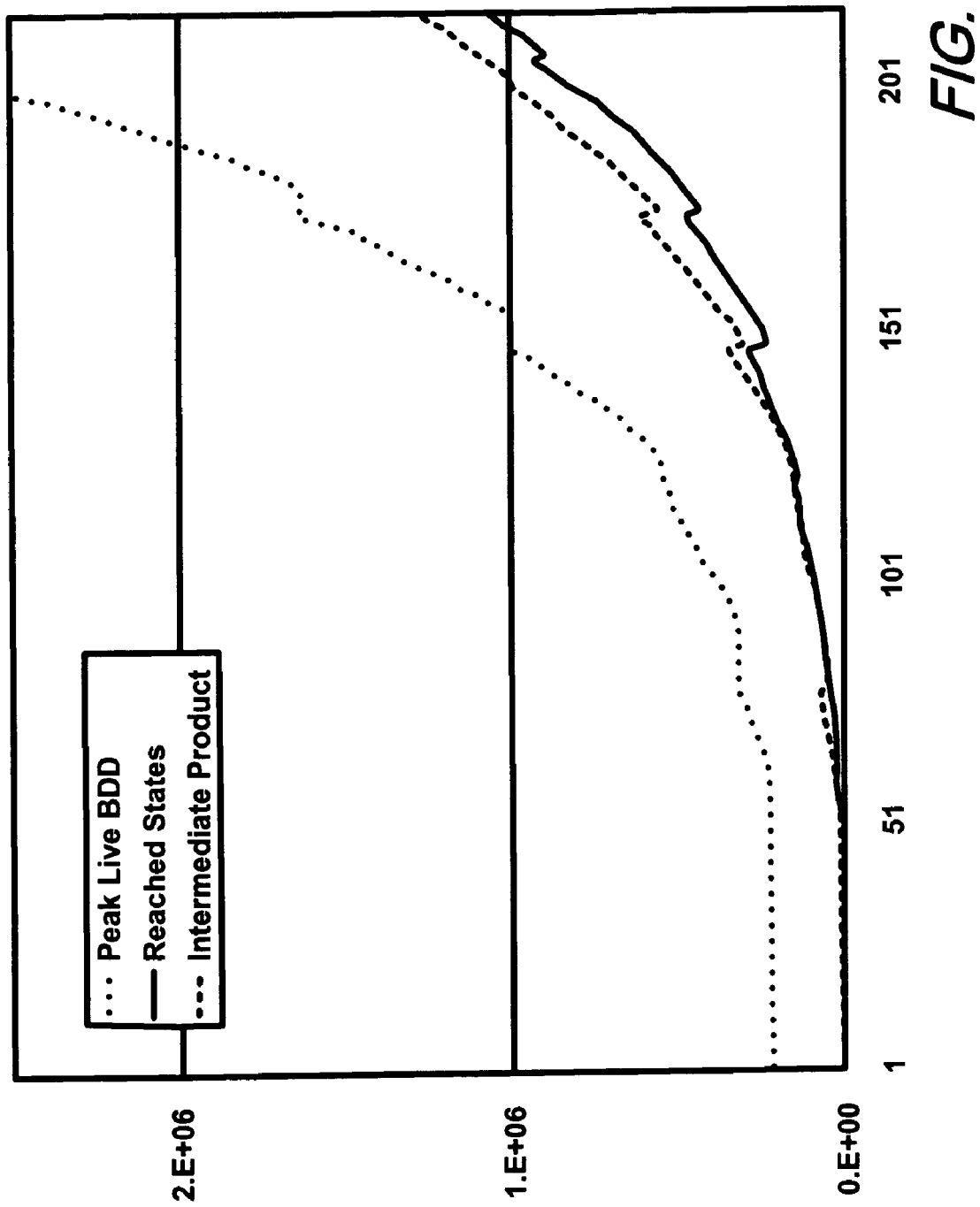
FIG. 4 is a graph showing PPP:BDD sizes at different reachabillity steps.

FIG. 4 shows the data collected from this verification model: Shown in that FIG. 4 are three curves which represent at each BFS (Breadth-First Search) step, 1) the peak number of live BDD nodes, 2) the BDD size for reachable states, and 3) the maximum BDD size for intermediate products. Among them, the first number represents the total memory usage.

The curves in FIG. 4 are typical when applying conventional symbolic model checking techniques to software models. All three measures plotted in FIG. 4 grow exponentially with the BFS step, indicating that as a reachability analysis continues, the BDD for reachable states grows rapidly in size. Due to the large number of program variables in software models, it is readily appreciated by those skilled in the art that such an exponential growth can quickly deplete the main memory. Of course, CPU time also grows in a similar fashion, since the complexity of BDD operations depends on the size of the BDDs. To mitigate the resulting memory blow-up, both the transition relation and reachable states must be reduced.

It is generally known by those skilled in the art that disjunctive partitioned representation of the transition relation can reduce the BDD size (See, e.g., J. Burch, "Using BDD's To Verify Multipliers",in 1991 *International Workshop on Formal Methods In VLSI Design*, Miami, Fla., January 1991). However, such methods are unfortunately applicable only to asynchronous systems, in which each process is treated as an atomic partition.

As those skilled in the art can readily appreciate, computing a disjunctive partition is a non-trival exercise. Fortunately however, for sequential programs a natural decomposition of the next-state functions exists. Note that in FIG. 3, $\delta_{y_i}$, is the union of a set of expressions, only one of which is active at any program location. Accordingly, if the transition relation T can be decomposed into the union of disjunctive components in a similar way, an expensive image computation can be divided into a set of cheaper ones. This results from the fact that existential quantification distributes among $\wedge$(but not, $\vee$), therefore individual image subsets can be computed with the smaller transition relation components in isolation. And since individual image subsets are much easier to compute, the peak memory usage throughout image computation is advantageously reduced.

Decomposition of Translation Relation

According to the creation of next-state functions described previously:

$$\delta_i(X, j/P) = e_{i,j}(X)$$

where (j/P) represents the substitution of P with the integer j. Similarly, $f(X/Y)$ will be used to denote the substitution of all the Y variables with X variables inside Function $f$. Note that $e_{i,j}(X)$ is actually the cofactor of $\delta_i(X, P)$ with respect to (P≡j).

If we let the cofactor of $f$ with respect to (P≡j) be denoted by $(f)_{(P\equiv j)}$, then cofactors of transition bit relations are given as follows:

$$(T_{y_i}) = (y_i \leftrightarrow \delta_{y_i})_{(P\equiv j)}$$
$$= (y_i \wedge \delta_{y_i} \vee \neg y_i \wedge \neg \delta_{y_i})_{(P\equiv j)}$$
$$= y_i \wedge (\delta_{y_i})_{(P\equiv j)} \vee \neg y_i \wedge \neg (\delta_{y_i})_{(P\equiv j)}$$
$$= y_i \wedge e_{i,j} \vee \neg y_i \wedge \neg e_{i,j}$$
$$= y_i \leftrightarrow e_{i,j}$$

and $$(T_{q_l})_{(P\equiv j)} = (q_l \leftrightarrow \delta_{q_l})_{(P\equiv j)}$$
$$= (q_l \wedge \delta_{q_l} \vee \neg q_l \wedge \neg \delta_{q_l})_{(P\equiv j)}$$
$$= q_l \wedge (\delta_{q_l})_{(P\equiv j)} \vee \neg q_l \wedge \neg (\delta_{q_l})_{(P\equiv j)}$$
$$= q_l \wedge e_{l,j} \vee \neg q_l \wedge \neg e_{l,j}$$
$$= q_l \leftrightarrow e_{l,j}$$

The entire transition relation T (X,P,Y,Q) can be disjunctively decomposed as follows:

$$T = \bigvee_j (P \equiv j) \wedge (T)_{(P\equiv j)}$$
$$= \bigvee_j (P \equiv j) \wedge \left( \prod_i T_{y_i} \wedge \prod_l T_{q_l} \right)_{(P\equiv j)}$$
$$= \bigvee_j (P \equiv j) \wedge \prod_i (T_{y_i})_{(P\equiv j)} \wedge \prod_l (T_{q_l})_{(P\equiv j)}$$

That is, an individual transition relation disjunct is given as:

$$(T)_{(P\equiv j)} = \prod_{1\le i \le N} (y_i \leftrightarrow e_{i,j}) \wedge \prod_{1 \le l \le M} (q_l \leftrightarrow e_{l,j})$$

By distributing existential quantification among ∨, $$EX_T D = \exists X, P \cdot D(X, P) \wedge T$$
$$= \exists X, P \cdot D(X, P) \wedge \bigvee_j (P \equiv j) \wedge (T)_{(P\equiv j)}$$
$$= \bigvee_j \exists X, P \cdot D(X, P) \wedge (P \equiv j) \wedge (T)_{(P\equiv j)}$$
$$= \bigvee_j \exists X \cdot D(X, j/P) \wedge (T)_{(P\equiv j)}.$$

In practice, one cannot afford to create transition relation disjuncts for all the individual-basic blocks (since the number of basic blocks can be in the thousands). Basic blocks are heuristically merged together to form a set of larger transition relation disjuncts. At the same time, the merit of disjunctive decomposition must be preserved as much as possible.

Note that $(T)_{(P\equiv j)}$ and $(T_{y_i})_{(P\equiv j)}$ are constructed directly from the software model, without first building T and $T_{y_i}$. When basic blocks are grouped into larger clusters, disjunctive transition relations for submodules ($\{T_i\}$) are also built directly (instead of building them for each block and then merging together). To do that, we only need to identify for each cluster (or submodule), the corresponding basic blocks and the corresponding $e_{i,j}$ for every program variable $x_i$. Also note that the transition relation disjunct $T_i$ itself may be represented as the conjunction of BDDs.

Our way of constructing disjunctive transition relations is different from prior art methods. More particularly, with the prior art approach as described by S. Barner and I. Rabinovitz in "Efficient symbolic model checing of software using partial disjunctive partitioning", in the 2003 *Correct Hardware Design and Verification Methods Converence*, one transition relation disjunct is created for each program variable based upon the existing conjunctive transition relation.

Since it requires $T_{y_i}$ to be built first, and it relies on quantification operations, the construction itself may be computationally expensive. Furthermore, a partition often contains statements scattered in different parts of the program, which makes it hard to exploit the variable locality. We will show later that without variable locality, the BDD representation of reachable states will be significantly larger, and the sequential depth of the finite state model may be longer.

Decomposition of Reachable States

Reachable states can also be represented disjunctively as the union of many reachable state subsets and in particular, one for each submodule:

$$R(X, P) = \bigvee_j (P \equiv j) \wedge R(X, j/P).$$

Under the partitioned representation of reachable states, image computation results need to be redistributed at every reachability step, as shown by the pseudo code in FIG. 5. With reference now to that FIG. 5, $R_i$ represents the reachable state subset associated with Block i, while $T_i$ represents its transition relation and img represents the standard image computation procedure for conjunctive partitioned transition relation.

Given K disjunctive submodules and K reachable subsets, the number of standard image computations at each reachability step is at most K. In addition, the result must be redistributed among all the submodules and the effort spent on redistribution is $O(K^2)$. An optimization of this algorithm based on control flow structure can make the complexity of redistribution O(E), where E is the number of edges of the control flow graph.

When basic blocks are merged together, the reachable state subsets should also be merged. Nevertheless, the resulting bigger subsets remain a disjunctive partition. Compared to a monolithic BDD, this partitioned representation may reduce the overall BDD size significantly.

Advantageously, there are two different approaches in implementing our disjunctive image computation algorithm. In the first approach, all transition relations (as well as their reachable subsets) follow the same BDD variable order. In this case, a single BDD manager is allocated to hold all the BDDs. Alternatively, different BDD variable orders can be used for different submodules (to build their individual transition relations and reachable state subsets). In this case, a separate BDD manager is allocated for every disjunctive submodule.

With multiple BDD managers, BDD size can be kept much smaller by having different variable orders for different BDDs. This advantageously makes it possible for our image computation to consume much less memory, and potentially speed up the computation. However, BDDs need to be transferred among different managers while propagating new reachable states. This may introduce problems, since an order that is good for one BDD may be extremely bad for another; therefore, dynamic variable reordering may be triggered during the transfer process.

As can be appreciated by those skilled in the art, frequent reordering may consume a lot of CPU time as well. In this sense, a multiple manager based approach is actually trading CPU time for memory. We have implemented both single and multiple BDD manager based approaches.

FIG. 4 shows a procedure for performing a reachability analysis with partitioned reachable subsets. The procedure shown in that FIG. 4 computes reachable states Frame-By-Frame (FBF). Alternatively, a reachability analysis may be performed Machine-by-Machine (MBM); that is, the analysis is performed on one individual submodule until it converges, after which the result is propagated to other submodules; this process iterates until no new state is discovered by any submodule. The advantage of MBM analysis is that it minimizes the traffic (data transfer) among different submodules; therefore it is appealing when distributed implementation is used. Advantageously, and in sharp contrast to the prior art ARCE algorithm, the result of our reachability analysis is always exact.

Simplification Using Variable Locality

We can now show how the early quantification of irrelevant variables and the use of variable live scope can simplify reachable state subsets.

Definition 1 The set of relevant variables with respect to Block j, denoted by $X_j^R$, comprises variables that appear in Block j (either in assignment statements or in conditional expressions).

The set $X_j^I = X \setminus X_j^R$, on the other hand, represents variables that are irrelevant to Block j. Although the number of program variables appearing in each basic block may be small, its transition relation disjunct always contains all the state variables of the model. Because if $x \in X_j^R$ then $(T_{y_i})_{(P=j)} = y_i \leftrightarrow \text{expr}(X);$ if $x \in X_j^I$ then $(T_{y_i})_{(P=j)} = y_i \leftrightarrow x_i$ $(T)_{(P=j)}$ is $$\prod_{x_i \in X_j^I}(y_i \leftrightarrow x_j) \wedge \prod_{x_i \in X_j^R}(T_{y_i})_{(P=j)} \wedge \prod (T_{q_l})_{(P=j)}$$

For a variable not in Block j, the bit-relation $(T)_{(p=j)}$ is reduced to $y_i \leftrightarrow x_i$, to make sure the value of $x_i$ remains unchanged. Boolean function $y_i \leftrightarrow x_i$ involves two variables and an XOR operator, therefore can be represented by a BDD with 3 nodes.

However, conjoining a large number of these BDDs together may produce a large BDD. XOR operators can produce BDDs with exponential number of nodes when a bad variable order is used; a good order for these XOR operators, on the other hand, may be bad for other BDDs encountered during image computations and the reachability analysis.

A closer look shows that, irrelevant variables can be quantified out earlier during image computation. By doing that, $\exists X. D(X, j/P) \wedge (T)_{(p=j)}$ can be simplified into:

$$\exists X_j^R \cdot D(X_j^R, X_j^I / Y_j^I, j/P) \wedge \prod_{x_i \in X_j^R}(T_{y_i})_{(P=j)} \wedge \prod (T_{q_l})_{(P=j)}$$

Early quantification of $X_j^I$ has the same effect as the substitution of these present-state variables with the corresponding next-state variables. However, the advantage of early quantification is that, one does not need to build $(T)_{(p=j)}$ in the first place; instead, a much simpler version is used. The potential BDD blow-up during quantification is also avoided. Therefore, in the implementation we use variable substitution instead of early quantification for these irrelevant variables. Experimental studies show that this is clearly a better choice.

Live Variables

Disjunctive decomposition and early quantification of irrelevant variables are aimed at simplifying the transition relation and the intermediate products in image computation. However, the BDDs of reachable state subsets can still be very large. Note that even with disjunctive partition, all the program variables may still appear in the reachable state subsets, which makes it increasingly hard to find a compact BDD. (In fact, this is the major reason for the exponential growth demonstrated in FIG. 4.)

However, many program variables are used only in a certain segment of the program; the values of these variables are meaningless outside their scopes. This is different from the state variables used in hardware models, whose values are updated concurrently in every clock cycles. This "variable locality" is illustrated by the example shown in FIG. 6, in which a and b are defined as local variables, while x; y and z are global variables.

After a program exits this block shown in FIG. 6, whatever values a and b presently have will be meaningless—they will affect neither the control flow nor the data path. However, if their values are carried on, they have to be represented as Boolean functions. This will make the BDD representation of reachable states unnecessarily large.

Fortunately, the live scope of a certain variable, defined as the set of basic blocks in which its value should be retained, can be collected directly from the source code. For example, any locally defined variable is valid only within the function/block where it is defined. However, such scopes are often not accurate enough as even global variables are often used only within a limited number of blocks.

Consequently, when the program execution becomes independent from their (the variables') values, even global variables should be regarded as out of their live scope. In FIG. 6, for instance, if the global variable x appears only in the above two blocks, it should be considered dead in all the other blocks. As a result, the only truly global variables in such a case are the PC variables, since their values are required in every block.

Live scope can be used to simplify the reachable state subsets, because as soon as the variables are no longer needed, their values should be removed from the reachable states. Therefore, variables that do not belong to this set should be existentially quantified out from the reachable subsets. The removal of dead variables can be implemented during the redistribution of new reachable states (FIG. 5): before new reachable states are distributed to a particular submodule, all variables that are not live in that submodule will be existentially quantified out. For our purposes, a formal definition of variable live scope is given as:

Definition 2 Block j is within the live scope of Variable $x_i$ if and only if there is a path from Block j to Block k where the value of $x_i$ is used.

For a program variable $x_i$, its live scope can be found by traversing the control flow graph backward: First, find all the blocks where the value of $x_i$ is used (i.e. either in the right-hand side of assignment statements or in the conditional expressions); then, trace back from these blocks recursively until reaching blocks where the value of $x_i$ is changed. Advantageously, this technique is general enough for both globally defined variables as well as locally defined variables.

If we let K be the number of blocks, E be the number of edges, and N be the number of state variables, the complexity of computing live scopes for all variables may be represented by $O((K+E) \times N)$. Of particular advantage, and as compared to symbolic model checking, the overhead is negligible. Still further advantage is realized in the fact that the algorithm that computes live scope it is one oftentimes used in control flow analysis, and consequently is well understood.

Early Convergence of Reachability Fixpoint

Removing variables out of their live scopes from reachable subsets is important, because it not only reduces the BDD sizes, but also leads to a potentially faster convergence of the reachability fix-point computation.

Take the C code segment shown in FIG. 8 as an example. Here we assume that each statement is a basic block, and all variables are defined as global variables. If Variables x and y are not used anywhere else in the program, the analysis outline in previous subsection indicates that x is live only in L3, while y is live only in L5. Taking this information into account, one can declare the termination of reachability analysis after going from L1 through L6 only once.

Advantageously, this is because the state discovered after L6, ($P \equiv 2 \wedge s \equiv 8$), is already covered by ($P \equiv 2$). However, if x and y are assumed to be live globally, reachability analysis cannot converge after the first pass. After L6, State ($P \equiv 2 \wedge x \equiv 7 \wedge y \equiv 8 \wedge s \equiv 8$) is not covered by an already reached state, since earlier the state was ($P \equiv 2 \wedge x \equiv 0 \wedge y \equiv 0$). As a result the reachability analysis needs two more steps to converge.

By identifying for each disjunctive submodule the dead variables and removing them from the reachable state subset, one can significantly reduce the BDD variables that are actually involved in image computations. This translates into more compact BDDs, faster image computation, and the potential early termination of reachability analysis.

Creating the Disjunctive Partition

We now explain how to group the entire set of basic blocks into disjunctive subsets. In principle, a separate transition relation can be constructed for each individual basic block. In fact, this approach maximizes the number of dead variables and irrelevant variables. However, the large number of basic blocks encountered in practice prevents one from doing that. Instead, basic blocks are merged into larger groups, for each of which a transition relation is built.

Ideally, we want to make as few groups as possible and at the same time retain the benefit of variable locality. This goal can be achieved by formulating a multi-way hypergraph partition problem. That is, all basic blocks are initially grouped together, starting from which recursive bi-partitioning is performed. A cost function needs to be defined so that bi-partitioning stops whenever the cost of a subset drops below a perdetermined threshold. The actual BDD size of the transition relation disjunct would be an ideal cost function, since we want to keep each individual transition relation as small as possible. However, it would be too expensive to build transition relations for all individual basic blocks and then start merging them. Therefore, an alternative but good indicator of the transition relation size of a group is needed. In our approach, the total number of relevant variables is chosen as such an indicator. Our motivation is that, the number of support variables of a BDD is often a good indicator of its size.

Next, we need to define the optimization criteria, e.g. what do we want to optimize? The following numbers can be good candidates, liveVar the number of shared live variables,
asgnVar the number of shared assigned variables,
cfgEdge the number of edges in the CFG.

Figure 9:
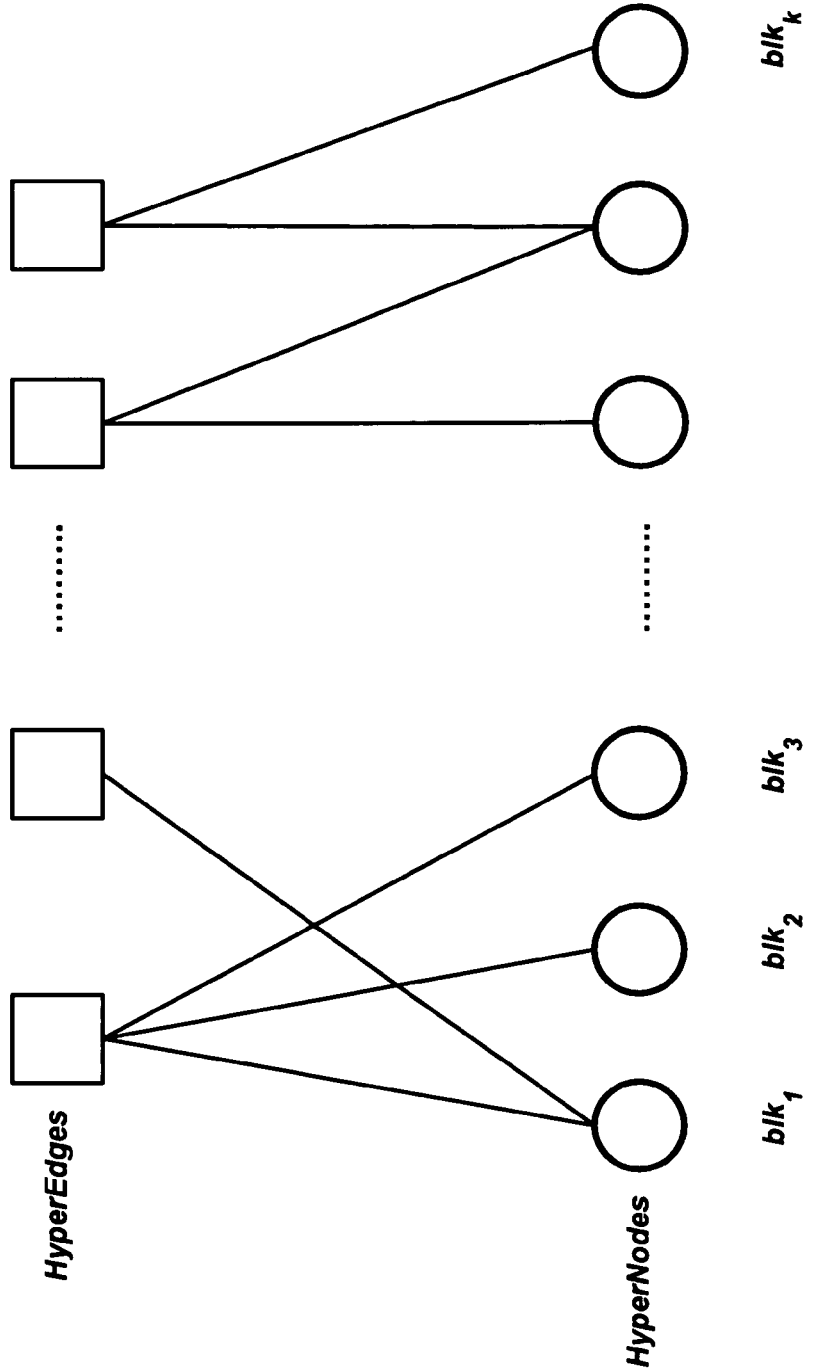
FIG. 9 is an example hypergraph.

Shared live variables are those that are live in both partitions, while shared assigned variables are those whose values are changed in both partitions (they appear in the left-hand side of assignment statements). Note that a smaller number of shared live variables indicates a higher degree of variable locality, since more dead variables can be quantified out from the reachable state subsets. A smaller number of shared assigned variables indicates that bit-relations with similar supports are grouped together. Merging BDDs with similar support variables is less likely to cause blow-ups. Less shared CFG edges means less traffic among different submodules. When two partitions are connected by a CFG edge, new reachable states may need to be transferred from one to the other. All three optimization criteria can be represented uniformly as a generic multi-way hypergraph partitioning problem. They differ only in the way hyperedges are defined. As is shown in FIG. 9, Hypernodes correspond to individual basic blocks, with one node for each block;
Hyperedges correspond to either program variables or edges in the CFG:
liveVar one edge is added for each variable, to connect blocks in which it is live.
asgnVar one edge is added for each variable, to connect blocks in which it is assigned.
cfgEdge one edge is added for each CFG edge, to connect the head and tail blocks.

We want to compute a multi-way partition of this hypergraph such that the cost of each group is below the predefined threshold, while the number of hyperedges across different groups is minimized. Note that although our live variable based partitioning method is similar to the MLP (Minimum Lifetime Permutation) algorithm of, they are designed for different applications. MLP is applied to a set of conjunctively partitioned transition relations to compute a good schedule for the conjoin-quantify operations. Our algorithm, on the other hand, is applied to a set of disjunctively partitioned transition relations, to group individual disjunctive transition relations into larger clusters (submodules). It is worth mentioning that, similar to the impact of quanti_cation schedule on classic image computation, a good disjunctive partition is also important for the performance of disjunctive image computation.

Disjunctive Method Experiments

We have implemented our new algorithm in the publicly available symbolic model checker VIS 2.0, which by default uses the CUDD package for BDD operations. The partitioning heuristics were implemented upon the hMeTis hypergraph partitioning package. We conducted experimental comparison of our new algorithm with the best known conventional method in VIS 2.0. For the purpose of controlled experiments, all image computation related parameters in VIS were kept unchanged; this includes the BDD partition method (set to frontier), the BDD partition threshold (set to 2000), and the image cluster size (set to 5000). The underlying conjunction scheduling algorithm was MLP [16]. Dynamic variable reordering were enabled throughout all the experiments, with the default reordering method .sift. All the experiments were run on a workstation with 2.8 GHz Xeon processors and 4 GB of RAM running Red Hat Linux 7.2. The set of benchmarks are typical embedded software, including PPP (Point-to-Point Protocol), Daisy (public available _le system), and Serial (Linux serial device driver). The properties we are checking includes the lock/unlock properties, fileopen/fileclose properties, and user-specified reachable properties.

Range analysis has been applied to reduce the number of bits need for encoding simple integer/char variables. In order to test the sheer capacity of BDD based algorithms, verification models are generated without predicate abstraction. In this sense, our software models are significantly more complex than Boolean programs (where only Boolean variables are allowed). These software models are also significantly larger than most of the hardware models that can be directly handled by symbolic model checkers. First, we give experimental comparison of our new algorithm and the conventional method on the PPP example.

Figure 10:
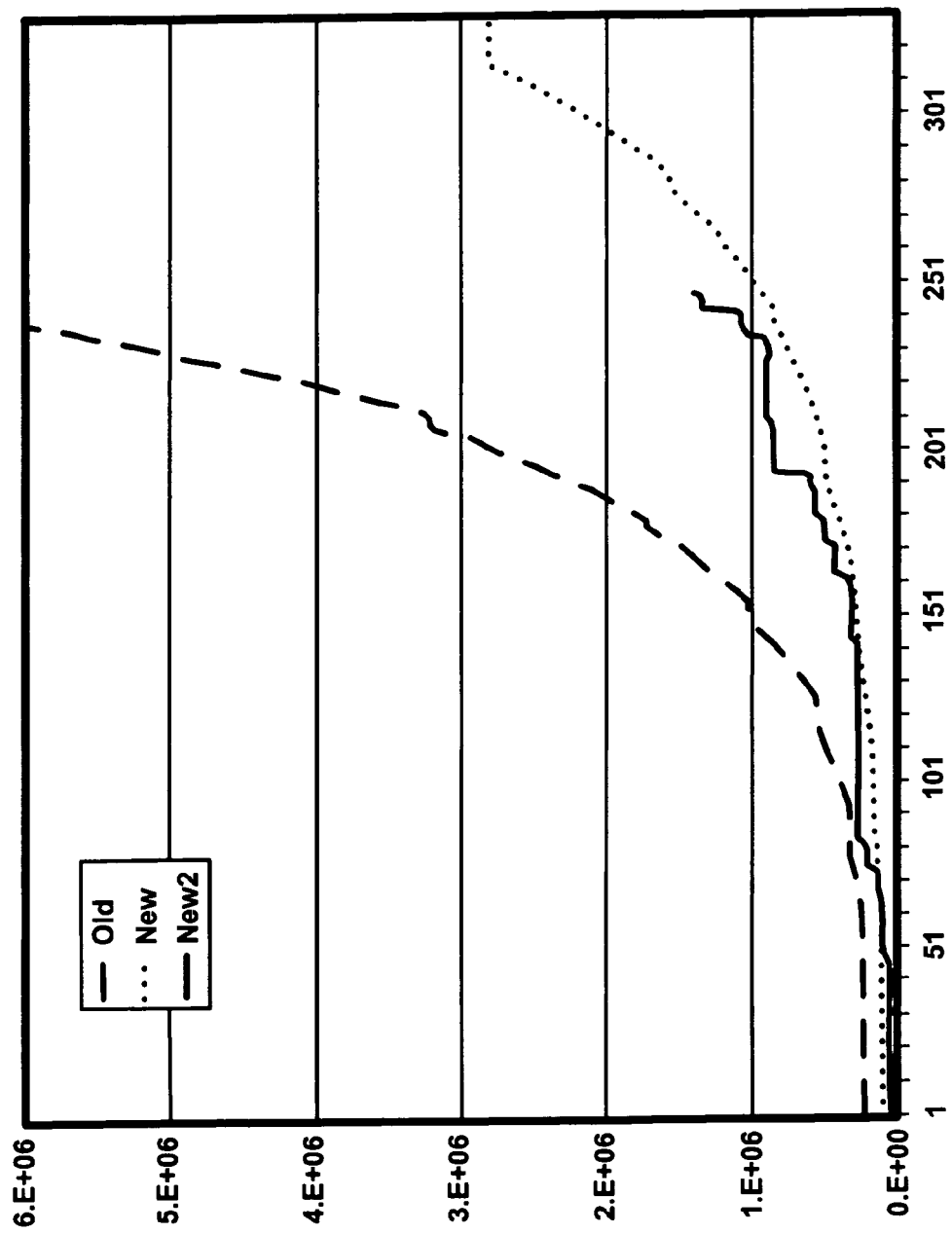
FIG. 10 is a graph showing PPP: Peak live BDD nodes in reachability analysis.

FIG. 10 shows the peak memory usage at each reachability step for both methods. Among the three curves, Old represents the conventional method, New represents our new method with a single BDD order, and New2 represents the one with multiple BDD orders. The x-axis represents the different BFS steps, while the y-axis represents the peak number of live BDD nodes. All experiments were ran with a time limit set to 4 hours, during which the conventional method completed 238 steps, while New and New2 completed 328 and 247 steps, respectively. The plateaus in the curves are caused by dynamic variable reordering. The result shows that our new disjunctive image computation method reduces the peak memory usage significantly compared to both New and New2, the curve of Old is much deeper. The reduction in BDD size also translates into reduction in CPU time. Both New and New2 can complete more steps than the Old.

Table 2 shows comparisons of the two methods on a larger set of test cases. In addition to PPP, it also includes models from Serial and Daisy and the time limit was set to 2 hours.

Columns 1-2 show for each test case the name and number of binary state variables of the model. Column 3 shows the sequential depth when reachability analysis converges. For test cases that cannot be completed by every method, we also give the comparison up to the maximum common BFS step (i.e. where all methods can reach); it is shown in parenthesis.

Columns 4-6 compare the CPU time in seconds; Columns 7-9 compare the peak number of live BDD nodes. The results presented in Table 2 show that the performance improvement achieved by our new method is significant and consistent. In particular, both New and New2 are significantly faster and consume less memory.

The improvements provided by our method in both CPU time and memory usage can be orders of magnitude better than prior method(s). And while New2 is still slower than New in most cases; nevertheless it is able to complete more BFS steps on the largest test case in the table.

Table 3 shows the comparisons of the three different partitioning heuristics: live-Var, assignedVar, and cfgEdge. They are all based on multi-way hypergraph partition, but differ in the optimization criteria.

We evaluate their impact on image computation by comparing the performance of reachability analysis. The CPU time and peak memory usage are compared in Columns 2-4 and Columns 5-7, of Table 3 respectively. In addition, Columns 8-10 compare the number of disjunctive partitions created by the different heuristics. All CPU time and memory usage data are compared after reachability analysis converges; the only two exceptions are PPP and Daisy (for which the data were compared at Step 228 and Step 70). The time limit for these experiments was set to 1 hour. All experiments were conducted with 1 hour time limit, with Method New (i.e. with a single BDD order), and with partition threshold (i.e. maximum number of live variables) set to 175.

Method New2 produces a result table similar to Table 3. The results presented in Table 3 show that the partitioning heuristic has a significant impact on the performance of disjunctive image computation. Furthermore, the liveVar based heuristic is better suited for a majority of the harder cases. 7.

Using Mixed Representations Instead of BDDS

Applying live variables to simplify BDD based disjunctive image computation has been studied and advantageously, we have obtained significant performance improvement. Herein, we study its application in model checking using a combination of multiple symbolic representations including BDDs, Presburger formulas, and linear constraints in the real domain.

In our implementation, we use the CUDD package for BDD related manipulations, the Omega library for Presburger formula related manipulations, and the Parma Polyhedral library for linear constraints in the real domain. Both the disjunctive transition relations and reachable state subsets are expressed in the mixed symbolic representations.

We build one disjunctive transition relation component $T_{ij}$ for each transition from block i to block j in the control flow graph. Let the transition between blocks i and j be guarded by the expression $cond_{ij}$, then $$T_{ij} = (P \equiv i) \wedge (P' \equiv j) \wedge cond_{ij} \wedge \bigwedge_{k \in K} x'_k \equiv e_{ik},$$

and $$T = \bigvee_{(i,j) \in E} T_{ij}$$

We make use of the live variable analysis for the following optimization. During the construction of the transition relation $T_{ij}$, if a certain variable $x_k$ is not live in the destination block $b_j$, we omit the transition relation component $x'_k \equiv e_{ik}$. This is because in the destination block, the value of $x_k$ is immaterial. Note that in this case, the next-state variable $x'_k$ can assume an arbitrary value thereby providing an abstraction of the state space. During image computation, all variables that are not live (called dead variables) in that destination location are automatically quantified out.

As can be appreciated, removing dead variables from reachable subsets not only reduces the sizes of the symbolic representations, but also leads to a potentially faster convergence of the reachability analysis. Take the piece of C code in FIG. 8 as an example. Here we assume that each statement is a basic block, and all variables are defined as global variables.

The program is valid because we do not perform any code optimization in model checking. If variables x and y are not used anywhere else in the program, the analysis outline in previous subsection indicates that x is live only in L2 while y is live only in L4; that is, their values should be preserved after the execution of L2 and L4 but nowhere else.

Taking this information into account, one can declare the termination of reachability analysis after going from L1 through L6 only once, as shown in Table 1. This is because the state discovered after L6, ($P \equiv 2 \wedge S \equiv 8$), is already covered by ($P \equiv 2$) (in which s can take any value). However, if x and y are assumed to be live globally, reachability analysis cannot converge after the first pass.

After L6, State ($P \equiv 2 \wedge x \equiv 7 \wedge y \equiv 8 \wedge S \equiv 8$) is not covered by an already reached state, since earlier the state is ($P \equiv 2 \wedge x \equiv 0 \wedge y \equiv 0$). Therefore, reachability analysis needs two more steps to converge.

Specialized Symbolic Search Strategies

There has been known a heuristic I speeding up symbolic fixpoint computation. For example, If we let $R^{i-1}$ and $R^i$ be the sets of already reached states from two consecutive iterations, then in computing $R^{i+1}$ one can use post($T, R^i/R^{i-1}$) instead of post ($T, R^i$). This will improve performance if symbolic representation of ($R^i/R^{i-1}$) is significantly than that of $R^i$, since post-condition I soften the most resource demanding operation. Note that in order to detect convergence, one still needs to store the entire set of already reached states (so that we can declare convergence when $R^{i+1} = R^i$.

The Frontier Strategy

We have observed that with mixed representations, maintaining the entire set of already reached states $R_i$, is very costly. It has been a well-known fact in BDD based model checking that the size of reachable state set often increases in the middle stages of fixpoint computation and then goes down when it is close to convergence. With polyhedra in our mixed representations, the case becomes even more severe in the sense that the "hump" is often steeper. This is largely due to the fact that the polyhedral power set representation for linear constraints is not conanical—after being propagated through various branching and re-converging points, polyhedra are fragmented more easily into smaller pieces (each with a larger number of linear inequalities).

Based on the above observation, we have developed a specialized symbolic search strategy that we call Reach Frontier. The idea is to avoid storing the entire set of reached states at each iteration, but instead use frontier set to detect convergence. Conceptually, the reachable frontier set is the set of new states reached at the current iteration, that is, $F^0 = I$, $F^i = \text{post}(T, F^{i-1}) \backslash F^i$. For streamline code whose labeled transition graph does not have cycles, we can declare convergence when $F^i$ becomes empty (and the set is guaranteed to become empty after a finite number of iterations). However, in the presence of cycles, the frontier set may never become empty (an example would be any program with an infinite loop).

To detect convergence in the presence of cycles, we need to identify the set of back edges in the labeled transition graph, whose removal will make the graph acyclic (an example is given in FIG. 11). Let Spa denote the set of tail blocks of those back edges. Then Spa effectively defines a state subspace.

In FIG. X, Spa=($P \equiv 5 \vee P \equiv 7 \vee P \equiv 8$). If we record all the reached state falling inside Spa, which is R∩Spa, then the emptiness of set (F\R∩Spa) can be used to detect convergence. We identify back edges by Depth-First Search (DFS) starting from the entry block. If the LTG is acyclic, the post-order of DFS gives a topological order and all edges are from lower rank blocks to higher rank blocks. The ranking in FIG. 11, for instance, happens to be their block indices. If the LTG has cycles, we identify all edges from higher ranked blocks to lower ranked blocks and label them as back edges. The removal of these edges makes the LTG a directed acyclic graph.

Our new procedure, shown in FIG. 12—Algorithm 1, takes as parameters the symbolic model <T,I >, the error block Err, as well as the tail blocks of back edges Spa. Notice that when Spa=true, it reduces to the ordinary reachability analysis procedure. The procedure is able to terminate as long as the ordinary procedure terminates.

Observation 2 Let D be the longest path starting from the entry block in the LTG after the removal of back edges. Then Reach frontier terminates with at most D more iterations after the conventional reachability analysis procedure terminates.

Finally, note that even the conventional reachability analysis procedure may not always converge in polyhedral abstract domain. However, such cases rarely happen in practice for our specific application.

The Lock-Step Strategy

Our frontier search strategy can significantly reduce the peak memory usage in the middle stages of fixpoint computation. However, there are still many cases for which even the mixed representation of $F^i$ becomes too large. When a LTG has multiple cycles of different lengths and the cycles are not well synchronized at the re-convergence points, new states (in frontier set) may easily scatter in a large number of basic blocks. Since this often means a larger number of polyhedra (and more linear constraints), the gain by our frontier strategy in reducing the size of states that we need to store gradually evaporates.

To address this problem, we developed another search strategy based on the frontier procedure called Reach_Lockstep. The idea is to synchronize multiple cycles by controlling the time when new states are propagated through back edges. For this we bi-partition the transition relation T into $T_f$ and $T_b$, such that $T_f$ consists of forward edges only and $T_b$ consists of back edges only. We conduct reachability analysis in lockstep, by first propagating the frontier set through $T_f$ until convergence, and then feeding back the set R∩Spa through $T_b$.

Our new procedure, given in FIG. 13—Algorithm 2, takes as parameters the symbolic model <$T_f, T_b, I$>, the error block Err, as well as the tail blocks of back edges Spa. It terminates only when no new state is reached by post-condition computations on both $T_f$ and $T_b$. Note that with the lock-step strategy we may get longer counter-examples. This is a disadvantage considering the fact that a shorter counter-example may be easier to understand. However, we shall show that there are some examples on which the frontier strategy takes much longer runtime or may not even finish in the allocated time; in these cases, lockstep becomes the only viable option.

Search Strategy Experiments

To evaluate our search strategies, we have implemented our inventive search strategy techniques on the F-Soft verification platform. Our mixed symbolic algorithm builds upon the known CUDD, Omega library, and the Parma Polyhedral libraries. We have been able to conduct performance evaluation by comparing to a well known composite model checking algorithm in, as well as pure Boolean level algorithms based on BDDs and SAT. Our benchmarks are C programs from public domain as well as industry, including Linux device drivers, network application software, and embedded programs in portable devices. For all test cases we check reachability properties. Our experiments were conducted on a workstation with 2.8 GHz Xeon processors and 4 GB of RAM running Red Hat Linux 7.2. We set the CPU time limit to one hour for all runs.

Comparing Different Search Strategies

First, we compare the performance of mixed symbolic procedure with and with-out program-specific optimizations and specialized search strategies. Without all these added simplifications, our implementation of the mixed algorithm becomes comparable to that of the prior art. The results are given in FIG. 17—Table 4; For each program under test, Columns 1-4 list the name, the lines of C code, the number of program variables, and the number of basic blocks.

Columns 5-8 compare the performance of the four different implementations, where old stands for the baseline algorithm, live stands for the one with live variable based simplification, front stands for the one fur—their augmented with frontier search strategy, and lstep stands for the one using lockstep strategy. Columns 9-12 compare the peak number of linear equalities and inequalities used in Omega library.

We choose not to report the peak BDD sizes because for these examples, the BDD sizes are often very small. Of the eleven test cases, bakery is a C modeling of the bakery protocol; tcas is an air traffic control and avionic system; ppp is a C modeling of the Point-to-Point protocol. The examples starting with mcf are from the embedded software of a portable device, for which we only have the verification models but no source code information (such as the lines of C code). Those examples whose names starting with ftpd are from the Linux FTP daemon.

Among the 11 experiments, the reachability computation without optimizations can only complete 2, while the one with optimizations and the lock-step strategy completes all. For the cases where all methods can do a complete traversal, the performance gained by the optimization is on order-of-magnitude. The experiments clearly show that exploiting the sequential nature and variable locality is a key to make software model checking scalable. The comparison of the number of linear constraints at each iteration shows that our proposed techniques are effective in reducing the size of the mixed symbolic representation.

Comparing with Pure Boolean Level Algorithms

We also give the comparison of mix-lockstep and pure Boolean level engines, including BDD based model checking and SAT based bounded model checking. We have carefully tuned both of these two Boolean level engines for handling sequential programs. In particular, our pure BDD based algorithm also has disjunctive partitioning and simplification based on live variables. The results are given in FIG. 18—Table 5.

With reference to that FIG. 18, it can be seen that columns 1-3 give the name of the program, the number of bit variables in the Boolean model and the sequential depth at which point all given properties can be decided. Columns 4-6 show for each of the three methods whether verification can be completed, and the maximum reached depth for the incomplete cases. Note that the BDD based methods may time out before the transition relation is built, in which cases the maximum reached depth is 0. Finally, Columns 7-9 list the run time of each method in seconds. Note that the comparison may not be apple-to-apple, since BDD/SAT models non-linear operations as bit-vector operations, while our mixed representation may approximate them. When approximation happens, we put a star in the last column.

The experimental data show that reachability computation using mixed symbolic representation is the only method that can complete traversal in all examples. This, we believe, is due to the fact that mix-lockstep models the different behaviors of the system at the right levels of abstractions.

It is useful to note that out method is significantly different from static analysis based on the polyhedral abstract domain, since we are conducting an exact state space exploration—none of our results are based on any convex hull based approximation or widening.

We have presented a disjunctive partitioned symbolic model checking algorithm for verifying sequential systems such as source code level C programs. We apply BDDs and a combination of multiple symbolic representations to model significantly richer data types and more complex expressions in a modern programming language, and develop optimizations specific to sequential models to improve the scalability of model checking algorithms. Experimental results show that our inventive method can significantly reduce the run time and peak memory usage required in symbolic model checking. Our implementation based on multiple symbolic representations also compares favorably to conventional pure Boolean level search engines using BDDs and SAT.

At this point, while we have discussed and described our invention using some specific examples, those skilled in the art will recognize that our teachings are not so limited. In particular the applicability of our inventive teachings to models derived from software as well as asynchronous hardware systems or interleaving models of concurrent systems will be readily apparent to skilled artisans. Accordingly, our invention should be only limited by the scope of the claims attached hereto.

What is claimed is:

1. A method for disjunctive image computation for software programs, the method comprising the steps of:
    decomposing a model of a software program stored in a memory device by building disjunctive transition relations for the software program, wherein the step of building disjunctive transition relations is performed using a processor and includes:
    dividing the basic blocks of the software program into subsets, so that a number of variables shared by subsets is minimized,
    directly creating a transition relation disjunct for each subset of basic blocks, and
    simplifying the transition relation disjunct by removing dead variables in each subset; and
    conducting a symbolic image computation for each of the disjunctive transition relations.

2. The method of claim 1 wherein the basic blocks of the software program are divided into subsets through the use of hyper-graph partitioning.

3. The method of claim 1 further comprising the step of:
    minimizing a number of live variables shared between subsets through the use of hyper-graph partitioning.

4. The method of claim 1 further comprising the step of:
    minimizing the number of assigned variables shared between subsets through use of hyper-graph partitioning.

5. The method of claim 1 wherein said symbolic image computation comprises a reachability analysis and employs a BDD based representation.

6. The method of claim 1 wherein said symbolic image computation comprises a reachability analysis and employs multiple symbolic representations.

* * * * *